(12) United States Patent
Rubel et al.

(10) Patent No.: US 6,399,182 B1
(45) Date of Patent: Jun. 4, 2002

(54) DIE ATTACHMENT UTILIZING GROOVED SURFACES

(75) Inventors: Erich K. Rubel, Phoenix; Jonathan H. Harris, Scottsdale; Gabriel M. Carrasco, Chandler, all of AZ (US)

(73) Assignee: CMC Wireless Components, Inc., Phoenix, AZ (US)

( * ) Notice: Subject to any disclaimer, the term of this patent is extended or adjusted under 35 U.S.C. 154(b) by 0 days.

(21) Appl. No.: 09/548,093

(22) Filed: Apr. 12, 2000

(51) Int. Cl.$^7$ ........................ H01L 23/495; B32B 3/28
(52) U.S. Cl. ...................... 428/167; 428/163; 428/212; 428/469; 428/627; 428/632; 428/672; 428/678; 156/153; 156/244.16; 29/558; 29/896.6; 257/666; 257/676
(58) Field of Search ............................... 257/666, 676, 257/669; 29/557, 558, 896.6; 156/153, 244.11, 244.16; 428/620, 450, 469, 702, 701, 212, 332, 163, 167, 220

(56) References Cited

U.S. PATENT DOCUMENTS

| | | | |
|---|---|---|---|
| 3,821,039 A | | 6/1974 | Ettenberg |
| 4,561,915 A | | 12/1985 | Mito |
| 4,781,775 A | * | 11/1988 | Reed et al. .................. 156/89 |
| 4,952,999 A | | 8/1990 | Robinson |
| 5,298,791 A | | 3/1994 | Liberty |
| 5,554,569 A | | 9/1996 | Ganesan |
| 5,708,294 A | | 1/1998 | Toriyama |
| 5,773,362 A | | 6/1998 | Tonti |
| 5,804,863 A | * | 9/1998 | Rhee .......................... 257/401 |
| 5,818,103 A | | 10/1998 | Harada |
| 5,825,087 A | | 10/1998 | Iruvanti |

FOREIGN PATENT DOCUMENTS

| | | | |
|---|---|---|---|
| EP | 031565 B1 | * | 5/1989 |
| JP | 361247057 A | * | 11/1986 |
| JP | 36119557 A | * | 5/1988 |
| JP | 405102207 A | * | 4/1993 |
| JP | 41125151510 A | * | 9/1999 |

OTHER PUBLICATIONS

Leo G. Feinstein, "Die Attachment Methods," Electronic Materials Handbook, ASM International (Materials Park, Ohio), (Nov. 11, 1989).

* cited by examiner

Primary Examiner—Deborah Jones
Assistant Examiner—Stephen Stein
(74) Attorney, Agent, or Firm—Renner, Kenner, Greive, Bobak, Taylor & Weber

(57) ABSTRACT

A substrate for a microelectronic package comprising a substrate that has grooves on a surface for bonding. A method for preparing a substrate for bonding comprising forming a grooved surface in the substrate for accepting a die for bonding, wherein the grooves are of sufficient size to provide a substantially uniform die bond, but no so large as to nullify the thermal path to the underlying substrate. A method for forming a bond between a substrate and a die comprising: providing a substrate and a die, wherein the substrate has grooves formed in a surface area for accepting the die for bonding and having a metallization thereon sufficient to form a eutectic bond with the die having a gold metallization thereon; and forming a eutectic bond between the substrate and the die comprising heating the substrate, contacting the metallized grooved surface of the substrate to the gold metallized surface of the die, scrubbing the die onto the substrate by moving the die back and forth while maintaining contact, and cooling the substrate and die. A microelectronic structure comprising a substrate and a die, wherein the substrate has grooves on a surface adapted for bonding with the die, and wherein a bond is formed between the substrate and the die.

60 Claims, 4 Drawing Sheets

DIE ATTACHMENT UTILIZING GROOVED SURFACES

FIELD OF THE INVENTION

The present invention is directed to bonding of microelectronic components. More particularly, the present invention is directed to die attachment wherein the substrate has a grooved surface.

BACKGROUND OF THE INVENTION

Microelectronic components can be bonded by the eutectic bonding process. Typical microelectronic components include high power discrete semiconductor devices such as power transistors, radio frequency and microwave frequency amplifiers, power control switches and the like. Devices of these types generate a significant amount of heat in operation, on the order of 10 to 500 watts, and thus require heat dissipation through their carriers, e.g. ceramic substrates, in order to prevent overheating and damage to the device, such as diminished performance or operational failure.

Heat conduction is required as part of the thermal management of the semiconductor device and also for heat experienced in assembly procedures such as die attachment, wire bonding, encapsulation, testing and the like. Heat dissipation is required to cool the devices during use.

As an example, microelectronic packages for power transistors have included a ceramic substrate on whose top surface the die is attached, and two metallized pads are disposed to which leads are attached and the die is wire bonded. A metal heat sink, such as copper, is disposed on the bottom surface of the ceramic substrate. The finished assembly is utilized in electronic apparatus containing circuit boards. The circuit board generally has cavities for accepting the power transistor package, and the bottom heat sink is placed in thermal contact with a heat sink located at the bottom of the cavity of the circuit board.

A microelectronic component is typically bonded to either ceramic or metallic substrates using the eutectic bonding process. The choice of metal or ceramic for the substrate depends on the particular type of microelectronic device being utilized-some devices require a thermally conducting, electrically insulating substrate, and other devices require a thermally conducting, electrically conducting substrate. The eutectic bonding process has become the standard form of attachment in the RF packaging industry because of its excellent thermal properties. In the eutectic bond process, the backside of a silicon chip (referred to as the die) is coated with a thin layer of gold. The substrate to which the die is bonded is usually plated with a metal such as nickel, followed by a relatively thick layer of gold. The substrate is then heated to a temperature of about 420° C. to about 440° C. The die is brought into contact with the hot gold surface. Immediately, a liquid alloy of gold and silicon is formed in-situ which solidifies upon cooling forming the die bond.

During solidification, the gold and silicon again segregate into discreet particles (or phases)—the gold phase being the most prevalent. The prevalence of the gold phase in the die bond results in a material with very high thermal conductivity, which can dissipate heat generated during the operation of the transistor die.

Information about die attachment methods is disclosed in "Die Attachment Methods" by Leo G. Feinstein, *Electronic Materials Handbook,* Vol. 1, 1989, ASM International, Materials Park, Ohio, pp. 213–223.

A problem with the eutectic bonding process is that the quality of the joint is unpredictable. Large voids can be formed in the gold/silicon joint, resulting in poor thermal contact between the die and the substrate, thus shortening the life of the device. The industry, however, has not addressed the cause of voiding.

U.S. Pat. No. 5,773,362 to Tonti et al. discloses a method for manufacturing a heat sink wherein the back of the silicon wafer is roughened. The roughened surface is coated with aluminum and chromium. Optionally, aluminum can be plated to fill the voids on the backside, followed by a chemical-mechanical polish to planarize the surface. While Tonti '362 roughens the backside of a silicon wafer, the roughened surface is coated and is not available during, the eutectic bonding process.

What is needed in the art is a die bond that is substantially free from large, non-uniform voids to provide for thermal dissipation.

It is therefore an object of the invention to provide a substrate for a microelectronic package that has grooves on a surface for bonding.

It is another object of the invention to provide a method of producing a substantially uniform bond by using a grooved substrate.

It is another object of the invention to provide a die bond that is substantially free from large, non-uniform voids.

SUMMARY OF THE INVENTION

The present invention provides a substrate for a microelectronics package comprising a substrate that has grooves on a surface for bonding.

The present invention also provides a method for preparing a substrate for bonding comprising forming a grooved surface in the substrate for accepting a die for bonding, wherein the grooves are of sufficient size to provide a substantially uniform die bond, but not so large as result in transistor cells that have no good thermal path to the underlying substrate.

The present invention also provides a method for forming a bond between a substrate and a die comprising: providing a substrate and a die; wherein the substrate has grooves formed in a surface area for accepting the die for bonding and having a metallization thereon sufficient to form a eutectic bond with the die having a gold metallization thereon; and forming a eutectic bond between the substrate and the die.

Forming the eutectic bond includes heating the substrate; contacting the metallized grooved surface of the substrate with the gold metallized surface of the die; scrubbing the die onto the substrate by moving the die back and forth while maintaining contact; and cooling the substrate and die.

The present invention also provides a microelectronic structure comprising a substrate and a die, wherein the substrate has grooves on a surface adapted for bonding with the die, and wherein a bond is formed between the substrate and the die.

DETAILED DESCRIPTION OF THE INVENTION

Figure 1A:
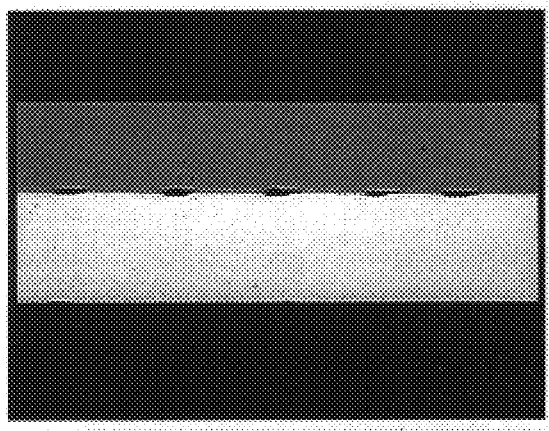
FIGS. 1A to 1D are photomicrographs (1A at 100×, 1B at 200×, and 1C and 1D at 500× magnification) that show the cross-section of a silicon die bonded to a grooved copper substrate by the eutectic method.
Figure 1B:
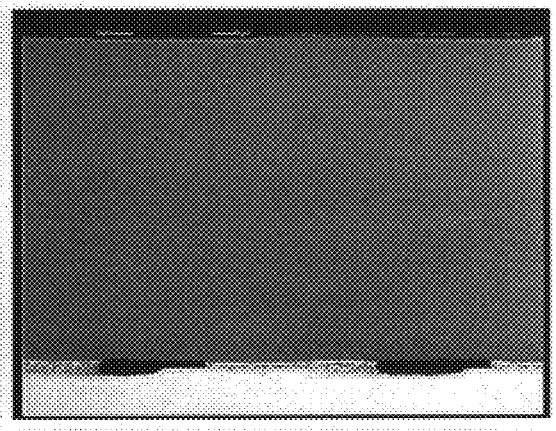
Figure 1C:
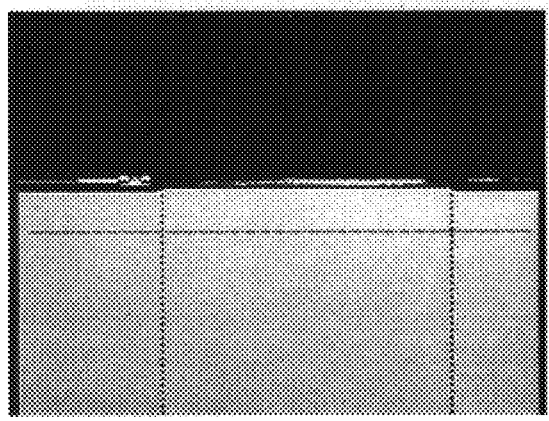
Figure 1D:
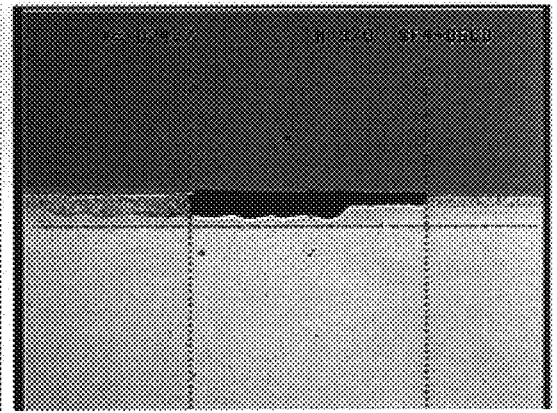

The present invention provides a substrate for a microelectronics package, which substrate has grooves on a surface for bonding.

Also provided according to the present invention is a method for preparing a substrate for eutectic bonding. A grooved surface is formed in the substrate for accepting a die for bonding, wherein the grooves are of sufficient size to provide a substantially uniform die bond, but not so large so as to provide transistor cells within the die with an insufficient thermal pathway to the underlying heat sink.

Also provided is a method for forming a bond between a substrate and a die. A substrate and a die are provided, wherein the substrate has grooves formed in a surface area for accepting the die for bonding. A bond is then formed between the substrate and the die.

By grooving the substrate, the location and morphology of any voids formed during bonding can be controlled. The resulting bond provided by using a grooved substrate is substantially free from large, non-uniform voids. Voids, if any at all, formed in a bond using the grooved substrate of the present invention are generally lenticular in shape. These lenticular voids are long and shallow with an aspect ratio ranging from about 25:1 to about 4:1. Additionally, the voids are generally about the same size or smaller than the individual transistor cells that comprise the transistor die. Generally, a transistor cell ranges in width from about 0.001 to about 0.006 inches and in length from about 0.005 to about 0.060 inches. Preferably, a transistor cell ranges from about 0.003 to about 0.004 inches in width and ranges from about 0.014 to about 0.033 inches in length. When voids are the same size or smaller than the size of the individual transistor cells, then the cells remain thermally connected to the underlying heat sink and the temperature of these cells remain stable.

When the formation of voids is not controlled, large non-uniform voids can be formed in the bond. This voiding results in transistor cells which are not connected thermally to the underlying heat sink material. Transistor cells with inadequate heat sinking become thermally unstable during operation and eventually burn-out. Often, one cell burning out will destroy the operation of the entire transistor. If this failure occurs during test, it will result in a rejected part, if it occurs in service, the whole module may need to be replaced in the base station.

The substrate is generally a metallic or ceramic component of a microelectronics package. The choice of ceramic or metal depends on the type of microelectronic device being utilized. Some devices require a thermally conducting, electrically insulating substrate, and others require a thermally conducting, electrically conducting substrate. Typical ceramics include, but are not limited to, alumina, aluminum nitride, and beryllia. Typical metal substrates can be Cu, Cu/W, Cu/Mo/Cu, Cu-graphite, or AlSiC.

The surface of the substrate that is bonded to the die is preferably metallized, that is, coated with a metal, followed by a layer of gold. The metal is at least one of nickel, cobalt, or nickel-cobalt alloy. Preferably, the metal is nickel-cobalt alloy. The metal layer is generally from about 50 μinches (microinches) to about 300 μinches thick. The gold layer is generally from about 20 μinches to about 300 μinches thick.

The die is generally a silicon wafer. Optionally, the die can be coated with a layer of gold on the surface that becomes a part of the bonded surface.

The bond between the substrate and the die can be accomplished by eutectic bonding, in-situ bonding, or solder (braze) preform bonding. The metals used in bonding can also include gold-silicon, gold-tin alloy, or gold-germanium alloy.

Forming a eutectic bond according to the present invention includes providing the grooved substrate. The grooved substrate has a metallization thereon sufficient to form a eutectic bond with the die. The die has a gold metallization on the surface that will be bonded to the substrate. The substrate is then heated. The grooved surface of the substrate is then contacted to the surface of the gold metallized surface of the die, which is scrubbed back and forth to form a gold-silicon alloy. The substrate and die are then cooled.

Forming a solder bond includes providing the grooved substrate and a die, which are heated. A thin foil of metal alloy that is about the same size as the die is placed between the heated grooved substrate and the heated die. The foil melts and the substrate is scrubbed back and forth to form the bond. The substrate and die are then cooled.

During the bonding process, the substrate is heated to a temperature sufficient to react the gold and silicon. Generally, this temperature ranges from about 350° C. to about 475° C. Preferably, this temperature ranges from about 420° C. to about 440° C. The silicon die is then contacted with the heated substrate. A liquid alloy of gold and silicon is formed in-situ, which solidifies upon cooling. The rate of cooling is generally not controlled.

The width of the grooves are generally in a range of width that provides for a substantially uniform die bond. The grooves generally range from about 2 to about 10 μm deep and about 50 to about 120 μm wide. Preferably, the grooves are about 4 μm to about 7 μm deep and about 75 μm to about 100 μm wide.

Preferably, the groove is a v-shape, a square shape, or a rounded shape as viewed in cross-section. Generally, the groove is angled from about 20° to about 70° relative to the major axis of the die. Preferably, the groove is angled about 45° relative to the major axis of the die. Additionally, the groove angle may be adjusted so as to minimize the amount of lenticular voiding that may occur under any given transistor cell.

Generally, the grooves are separated by an area called a land. The width of the lands are generally in a range of width that provides for a substantially uniform die bond. Generally the land is about 50 μm to about 120 μm wide. Preferably, the land is about 75 μm to about 100 μm wide.

Without being limited to theory, it is theorized that the grooves channelize and provide a means of escape for entrapped gasses. This channelization results in controlled, minimal, and uniform voiding in the bond.

Fine, uniformly distributed voids do not adversely affect thermal dissipation in a gold/silicon eutectic bond because heat can easily move from the die to the substrate below by circumventing the narrow waist of the void. This results in bonding that is consistent and predictable, which in turn provides for high device yields, longer device life and improved reliability in operation.

Another benefit provided by the grooves is that the use of higher powered dies is enabled. The uniformity and the thermal transfer capability allows the higher powered dies to be used. Also, thinner gold plates may be used because of the increased thermal conductivity and uniformity of the bond.

The grooves can be produced on both metal components and ceramic substrates. On metal components, the grooves can be produced by any suitable means, such as mechanical milling, chemical milling, stamping, or coining. Grooves on ceramic substrates can be produced by any suitable means, such as forming the substrate having grooves by injection molding, laminating, hot pressing, green machining, selective printing of thick film paste to be co-fired or post-fired, or imprinting or stamping on thick film paste that is applied to an already fabricated substrate.

In FIGS. 1A to 1D, the cross-section was made along the major axis of the die, transverse to the primary plane of the substrate. The photomicrographs demonstrate the uniformly distributed voids obtained according to the present invention.

Figure 2:
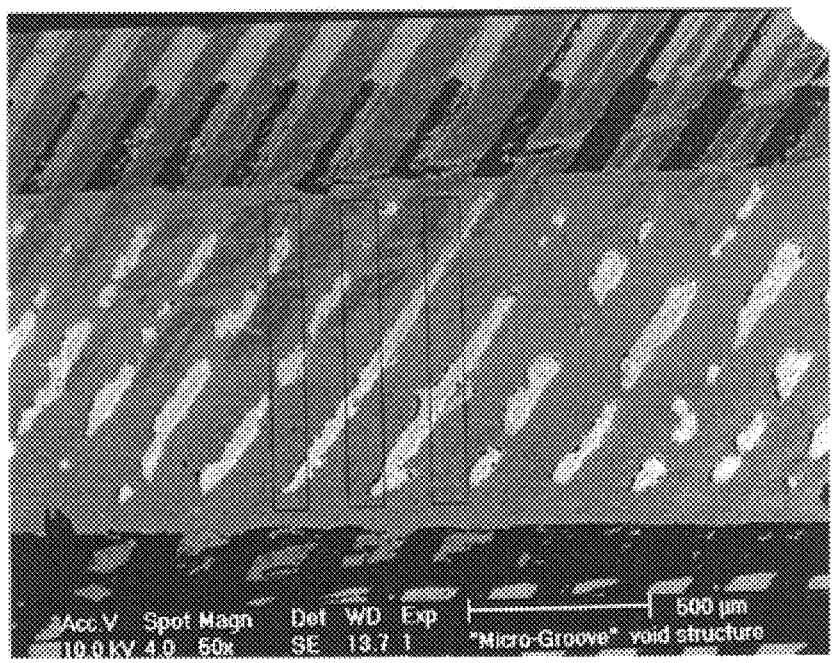
FIG. 2 is a photomicrograph that shows a cross-section of the void morphology obtainable when bonding a silicon die to a grooved copper substrate.

The sample shown in FIG. 2 was cross-sectioned parallel to the primary plane of the die and substrate to reveal a portion of the die bond (shown as a horizontal gray rectangle). The associated lenticular voids appear as white structures oriented at about 50 degrees relative to the die. The superimposed black rectangles represent the position and size of transistor cells relative to the voids.

Figure 3:
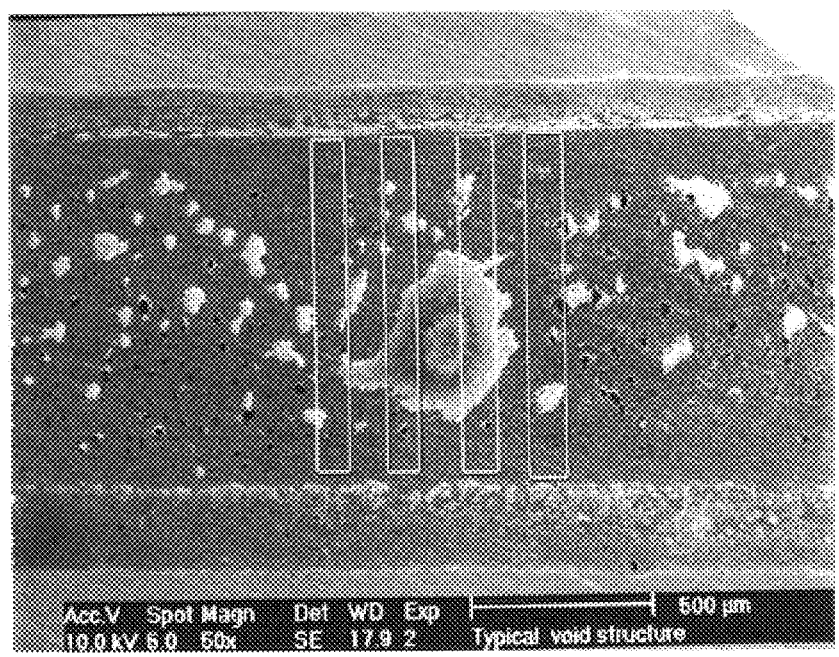
FIG. 3 is a photomicrograph that shows a cross-section of a die bond made on a non-grooved substrate.
Figure 4:
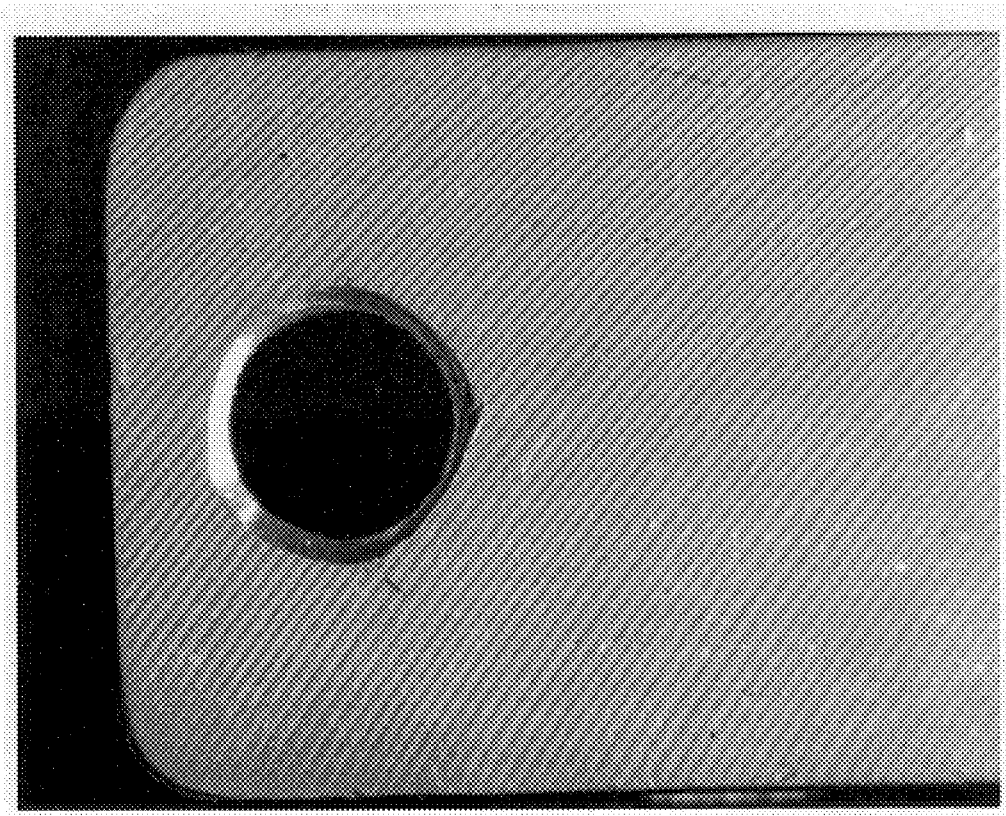
FIG. 4 is a photograph (at 10× magnification) that depicts a portion of a grooved copper substrate which has been plated with nickel and gold in preparation for eutectic bonding of a silicon die.

Voids appear as generally circular white areas in FIG. 3. Transistor cells are represented by white rectangles. Note the large void in the center that could cause an insufficient thermal path between one or more cells and the substrate.

Figure 5:
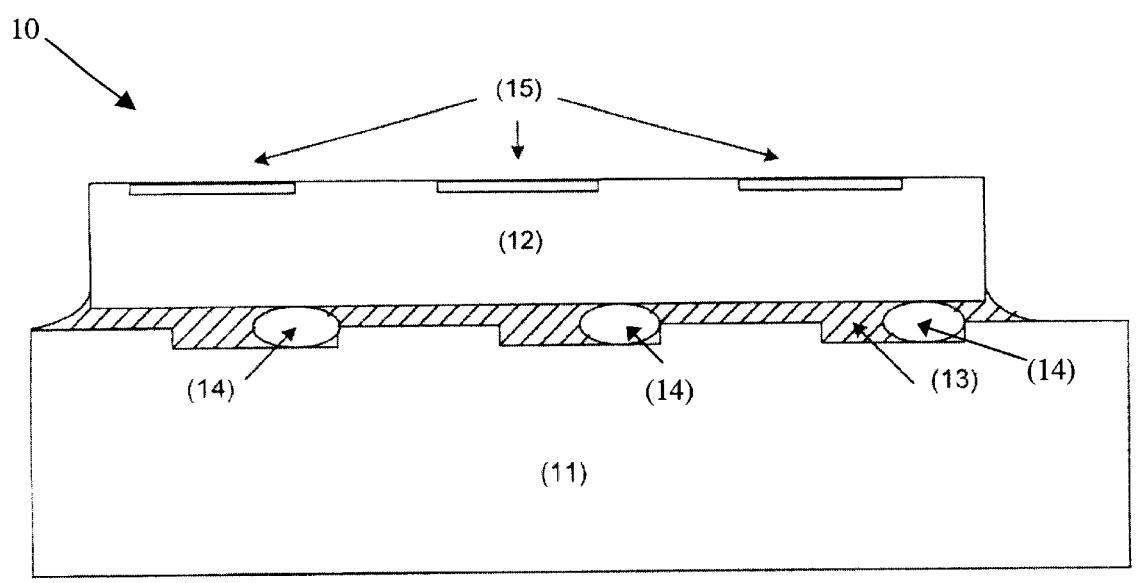
FIG. 5 is a schematic of a bond provided using a grooved substrate.

FIG. 5 is a schematic representation of a bond in a microelectronic device (10) provided by the present invention by using a grooved substrate. Substrate (11) is grooved and a die (12) with transistor cells (15) is bonded to the substrate (11). A bond (13) is formed between the substrate (11) and the die (12). Some small, uniform voids (14) may be formed within the bond (13).

The process of the present invention also provides a bond that is substantially free of large, non-uniform voids.

SPECIFIC EMBODIMENTS OF THE PRESENT INVENTION

EXAMPLE 1

Solid copper substrates (flanges) were selected. It was noted that the flanges were milled to their dimensions starting from copper plate. Machining marks were visible on the surface of the flanges.

Forty (40) flanges were plated with 100 microinches of a nickel-cobalt alloy (Uyemura Thru-Nic bath, cobalt doped), followed by 150 microinches of Type III soft gold (Lea Ronal-6 bath). Five (5) gold metallized silicon dies, with dimensions of 0.413×0.040×0.010 inches, were bonded to five(5) flanges using a Kulicke & Soffa eutectic die bonder, Model 648-3, at a temperature of 430° C.

The quality of the die bonds were evaluated by X-ray radiography, a technique used to detect voids in gold/silicon joints. Surprisingly, 4 of the 5 showed minimal voiding. The voids that were observed in these joints appeared to run parallel to each other and were evenly distributed across the entire die bond area. The fifth sample showed a more typical void structure; i.e., voids of random shape and size with some quite large.

Upon investigating the samples, it was noticed that the fifth sample did not possess the mill marks described above. Initial observations were that the mill marks on the bonding surfaces, which were in effect substantially parallel grooves, were responsible for the excellent quality of the die bonds described above. Two (2) of the samples with the mill marks were metallographically cross-sectioned and the radiographic observations were verified.

Sixteen (16) additional plated flanges, which exhibited the mill marks, were die bonded in a like manner and evaluated by radiography. All sixteen exhibited the same fine, lenticular void structure. This indicated that the process was extraordinarily repeatable.

Comparative Example 1

The group of flanges from above were sorted, and flanges without mill marks (these flanges appeared to be lapped) were selected. Five (5) of these lapped flanges were then die bonded, using the same conditions described in Example 1, and radiographed. In all of these samples, voids were randomly distributed by both size and shape. Two of these samples, for example, showed extensive voiding over one half of the die bond area while the other half was bonded well, with small dispersed porosity. This showed that results were random and unpredictable.

Comparative Example 2

The die bond surfaces of five (5) unplated copper flanges were polished to a mirror finish. These flanges were then plated with the nickel-cobalt alloy and gold as described in Example 1. Die bonding was then preformed under the same conditions as in Example 1. The samples were then radiographed. Three of the five samples possessed large circular voids in the die bond area, while the remaining two samples were bonded quite well, showing only small, dispersed porosity. This shows that results were random and unpredictable.

Therefore, the present invention, as described above, provides a grooved substrate, a method of forming the grooved substrate, a bond between the substrate and a die in a microelectronic structure, and a method for producing the bond between the substrate and the die.

It should be appreciated that the present invention is not limited to the specific embodiments described above, but includes variations, modifications and equivalent embodiments defined by the following claims.

What is claimed is:

1. A substrate for a microelectronic package comprising a substrate that has a plurality of substantially parallel grooves in a surface area for accepting a die for bonding, positioned at an angle from about 20° to about 70° relative to the major axis of the die to be bonded.

2. The substrate of claim 1, wherein the grooves have a depth of about 2 $\mu$m to about 10 $\mu$m, and a width of about 50 $\mu$m to about 120 $\mu$m.

3. The substrate of claim 1, wherein the grooves have a depth of about 4 $\mu$m to about 7 $\mu$m, and a width of about 75 $\mu$m to about 100 $\mu$m.

4. The substrate of claim 1, wherein the grooves are separated by a land, wherein the land has a width from about 50 $\mu$m to about 120 $\mu$m.

5. The substrate of claim 1, wherein the grooves are separated by a land, wherein the land has a width from about 75 $\mu$m to about 100 $\mu$m.

6. The substrate of claim 1, wherein the grooves have at least one shape in cross-section selected from the group consisting of a V-shape, square shape, and rounded shape.

7. The substrate of claim 1, wherein the substrate is a ceramic substrate.

8. The substrate of claim 7, wherein the ceramic substrate is selected from the group consisting of alumina, aluminum nitride, and beryllia.

9. The substrate of claim 7, wherein the grooves are provided by forming the substrate having grooves by at least one method selected from the group consisting of injection molding, laminating, hot pressing, and green machining.

10. The substrate of claim 7, wherein the grooves are provided by applying a thick film paste to the substrate and then further processing by at least one method selected from the group consisting of selectively printing, selectively imprinting, and selectively stamping on the thick film paste.

11. The substrate of claim 1, wherein the substrate is a metal.

12. The substrate of claim 11, wherein the substrate is selected from the group consisting of copper, Cu/W, Cu/Mo/Cu, Cu-graphite, and AlSiC.

13. The substrate of claim 11, wherein the grooves are provided by at least one method selected from the group consisting of mechanical milling, chemical milling, stamping, and coining, the substrate.

14. A method for preparing a substrate for bonding comprising forming a plurality of substantially parallel grooves in the surface in the substrate for accepting a die for bonding, wherein the grooves are positioned at an angle from about 20° to about 70° relative to the major axis of the die to be bonded, and are of sufficient size to provide a substantially uniform die bond.

15. The method of claim 14, wherein the grooves are not so large so as to nullify a thermal path between the substrate and transistor cells disposed on the die.

16. The method of claim 14, wherein the bonding is one of eutectic bonding, in-situ bonding, and solder preform bonding.

17. The method of claim 14, wherein the grooves have a depth of about 2 $\mu$m to about 10 $\mu$m, and a width of about 50 $\mu$m to about 120 $\mu$m.

18. The method of claim 14, wherein the grooves have a depth of about 4 $\mu$m to about 7 $\mu$m, and a width of about 75 $\mu$m to about 100 $\mu$m.

19. The method of claim 14, wherein the grooves are separated by a land, wherein the land has a width from about 50 $\mu$m to about 120 $\mu$m.

20. The method of claim 14, wherein the grooves are separated by a land, wherein the land has a width from about 75 $\mu$m to about 100 $\mu$m.

21. The method of claim 14, wherein the grooves have a shape in cross-section that is at least one of V-shape, square shape, and rounded shape.

22. The method of claim 14, wherein the substrate is a ceramic substrate.

23. The method of claim 22, wherein the ceramic substrate is selected from the group consisting of alumina, aluminum nitride, and beryllia.

24. The method of claim 22, wherein the forming the grooves is by forming the substrate having grooves by one of injection molding, laminating, hot pressing, and green machining.

25. The method of claim 22, wherein the forming the grooves is by applying a thick film paste to the substrate and then one of selectively printing, imprinting, and stamping on the thick film paste.

26. The method of claim 14, wherein the substrate is a metal.

27. The method of claim 26, wherein the metal is selected from the group consisting of copper, Cu/W, Cu/Mo/Cu, Cu-graphite, and AlSiC.

28. The method of claim 26, wherein the forming the grooves is one of mechanical milling, chemical milling, stamping, and coining.

29. The method of claim 14, including metallizing the grooved surface for eutectic bonding with a silicon die having a gold metallization thereon.

30. The method of claim 29, wherein metallizing the grooved surface is with a metal selected from the group consisting of nickel, cobalt, and nickel-cobalt alloy, followed by gold.

31. The method of claim 29, further comprising forming a eutectic bond between the substrate and the die.

32. The method of claim 31, wherein forming the eutectic bond comprises:
  a. metallizing the grooved surface of the substrate sufficiently to permit forming a eutectic bond with the die;
  b. metallizing the die with gold sufficiently to permit forming a eutectic bond with the substrate;
  c. heating the substrate;
  d. contacting the metallized grooved surface of the substrate to the surface of the metallized die;
  e. scrubbing the die onto the substrate by moving the die back and forth while maintaining contact with the substrate; and
  f. cooling the substrate and die.

33. The method of claim 32, wherein the bond is substantially free of large non-uniform voids.

34. The method of claim 32, wherein if voids are present in the bond, the voids are at least one of lenticular in shape and not larger in size than a die transistor cell.

35. The method of claim 34, wherein the voids are lenticular and have an aspect ratio from about 25:1 to about 4:1.

36. The method of claim 34, wherein the die transistor cell has a width from about 0.001 inches to about 0.006 inches, and a length from about 0.005 inches to about 0.060 inches.

37. The method of claim 32, wherein metallizing the grooved surface is with a metal selected from the group consisting of nickel, cobalt, and nickel-cobalt alloy.

38. The method of claim 14 further comprising forming a bond between the substrate and the die, wherein the bond is one of a eutectic bond, an in-situ bond, and a solder preform bond.

39. The method of claim 38, wherein the bond is formed from a metal selected from the group consisting of gold-silicon, gold-tin alloy, and gold-germanium alloy.

40. A method for forming a bond between a substrate and a die comprising:
  a: providing a substrate and a die, wherein the substrate has plurality of substantially parallel grooves positioned at an angle from about 20° to about 70° relative to the major axis of the die to be bonded, and which are formed in a surface for accepting the die for bonding and having a metallization thereon sufficient to from a eutectic bond with the die having a gold metallization thereon; and
  b: forming a eutectic bond between the substrate and the die comprising: heating the substrate; contacting the metallized grooved surface of the substrate with the gold metallized surface of the die; scrubbing the die on to the substrate by moving the die back and forth while maintaining contact; and cooling the substrate and die.

41. A microelectronic structure comprising a substrate and a die, wherein the substrate has a plurality of substantially parallel grooves angled from about 20° to about 70° relative to the major axis of the die on a surface adapted for bonding with the die, and wherein a bond is formed between the substrate and the die.

42. The microelectronic structure of claim 41, wherein the grooves have a depth of about 2 µm to about 10 µm, and a width of about 50 µm to about 120 µm.

43. The microelectronic structure of claim 41, wherein the grooves have a depth of about 4 µm to about 7 µm, and a width of about 75 µm to about 100 µm.

44. The microelectronic structure of claim 41, wherein the grooves are separated by a land, wherein the land has a width from about 50 µm to about 120 µm.

45. The microelectronic structure of claim 41, wherein the grooves are separated by a land, wherein the land has a width from about 75 µm to about 100 µm.

46. The microelectronic structure of claim 41, wherein the grooves have at least one cross-sectional shape that is selected from the group consisting of a V-shape, square shape, and rounded shape.

47. The microelectronic structure of claim 41, wherein the substrate is a ceramic substrate.

48. The microelectronic structure of claim 47, wherein the ceramic substrate is selected from the group consisting of alumina, aluminum nitride, and beryllia.

49. The microelectronic structure of claim 47, wherein the grooves are provided by forming the substrate having grooves by at least one method selected from the group consisting of injection molding, laminating, hot pressing, and green machining.

50. The microelectronic structure of claim 47, wherein the grooves are provided by applying a thick film paste to the substrate and then further processing by at least one method selected from the group consisting of selectively printing, selectively imprinting, and selectively stamping on the thick film paste.

51. The microelectronic structure of claim 41, wherein the substrate is a metal.

52. The microelectronic structure of claim 51, wherein the metal that is selected from the group consisting of copper, Cu/W, Cu/Mo/Cu, Cu-graphite, and AlSiC.

53. The microelectronic structure of claim 51, wherein the grooves are provided by at least one method selected from the group consisting of mechanical milling, chemical milling, stamping, and coining, the substrate.

54. The microelectronic structure of claim 41, wherein the bond is at least one selected from the group consisting of a eutectic bond, an in-situ bond, and a solder preform bond.

55. The microelectronic structure of claim 41, wherein if voids are present in the bond, the voids are at least one of lenticular in shape and not larger in size than a die transistor cell.

56. The microelectronic structure of claim 55, wherein the voids are lenticular and have an aspect ratio from about 25:1 to about 4:1.

57. The microelectronic structure of claim 55, wherein the die transistor cell has a width from about 0.001 inches to about 0.006 inches, and a length from about 0.005 inches to about 0.060 inches.

58. The microelectronic structure of claim 41, wherein the substrate is metallized with a metal selected from the group consisting of nickel, cobalt, and nickel-cobalt alloy, followed by a gold metallization.

59. The microelectronic structure of claim 47, wherein the bond is at least one selected from the group consisting of a eutectic bond, an in-situ bond, and a solder preform bond.

60. The microelectronic structure of claim 41, the bond is formed from a metal selected from the group consisting of gold-silicon, gold-tin alloy, and gold-germanium alloy.

* * * * *